United States Patent
Bao et al.

(10) Patent No.: US 9,905,476 B2
(45) Date of Patent: Feb. 27, 2018

(54) ALTERNATIVE THRESHOLD VOLTAGE SCHEME VIA DIRECT METAL GATE PATTERNING FOR HIGH PERFORMANCE CMOS FINFETS

(71) Applicant: GLOBALFOUNDRIES INC., Grand Cayman (KY)

(72) Inventors: Ruqiang Bao, Wappingers Falls, NY (US); Siddarth A. Krishnan, Newark, CA (US); Unoh Kwon, Fishkill, NY (US); Keith Kwong Hon Wong, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/412,598

(22) Filed: Jan. 23, 2017

(65) Prior Publication Data

US 2017/0133278 A1 May 11, 2017

Related U.S. Application Data

(62) Division of application No. 14/738,288, filed on Jun. 12, 2015, now Pat. No. 9,553,092.

(51) Int. Cl.
| | |
|---|---|
| H01L 21/8238 | (2006.01) |
| H01L 27/092 | (2006.01) |
| H01L 21/3213 | (2006.01) |
| H01L 29/49 | (2006.01) |
| H01L 29/51 | (2006.01) |
| H01L 29/66 | (2006.01) |
| H01L 27/11 | (2006.01) |

(Continued)

(52) U.S. Cl.
CPC ........ *H01L 21/823821* (2013.01); *H01L 21/28088* (2013.01); *H01L 21/32139* (2013.01); *H01L 21/8234* (2013.01); *H01L 21/823842* (2013.01); *H01L 21/823864* (2013.01); *H01L 27/0922* (2013.01); *H01L 27/0924* (2013.01); *H01L 27/1104* (2013.01); *H01L 29/435* (2013.01); *H01L 29/4958* (2013.01); *H01L 29/4966* (2013.01); *H01L 29/517* (2013.01); *H01L 29/66545* (2013.01)

(58) Field of Classification Search
CPC ........ H01L 21/82345; H01L 21/66795; H01L 27/0924; H01L 27/0922; H01L 21/823842; H01L 29/435; H01L 29/495; H01L 29/4925–29/4941; H01L 21/28088
See application file for complete search history.

(56) References Cited

U.S. PATENT DOCUMENTS

| | | |
|---|---|---|
| 6,699,756 B1 | 3/2004 | Hsiao |
| 7,718,496 B2 | 5/2010 | Frank et al. |

(Continued)

OTHER PUBLICATIONS

Choi, K., et al., "The effect of metal thickness, overlayer and high-k surface treatment on the effective work function of metal electrode," Proceedings of 35th European Solid-State Device Research Conference, ESSDERC, Sep. 12-16, 2005, pp. 101-104.

*Primary Examiner* — Jesse Y Miyoshi
*Assistant Examiner* — John Bodnar
(74) *Attorney, Agent, or Firm* — Scully, Scott, Murphy & Presser, P.C.

(57) ABSTRACT

Multiple gate stack portions are formed in a gate cavity by direct metal gate patterning to provide FinFETs having different threshold voltages. The different threshold voltages are obtained by selectively incorporating metal layers with different work functions in different gate stack portions.

20 Claims, 12 Drawing Sheets

(51) Int. Cl.
   *H01L 29/43* (2006.01)
   *H01L 21/8234* (2006.01)
   *H01L 21/28* (2006.01)

(56) References Cited

U.S. PATENT DOCUMENTS

| | | |
|---|---|---|
| 7,855,105 B1 | 12/2010 | Jagannathan et al. |
| 8,067,287 B2 | 11/2011 | Baumgartner |
| 8,110,467 B2 | 2/2012 | Chang et al. |
| 8,294,180 B2 | 10/2012 | Doyle et al. |
| 8,420,473 B2 | 4/2013 | Ando et al. |
| 2009/0152636 A1 | 6/2009 | Chudzik et al. |
| 2012/0280330 A1 | 11/2012 | Lee et al. |
| 2013/0154019 A1 | 6/2013 | Ando et al. |

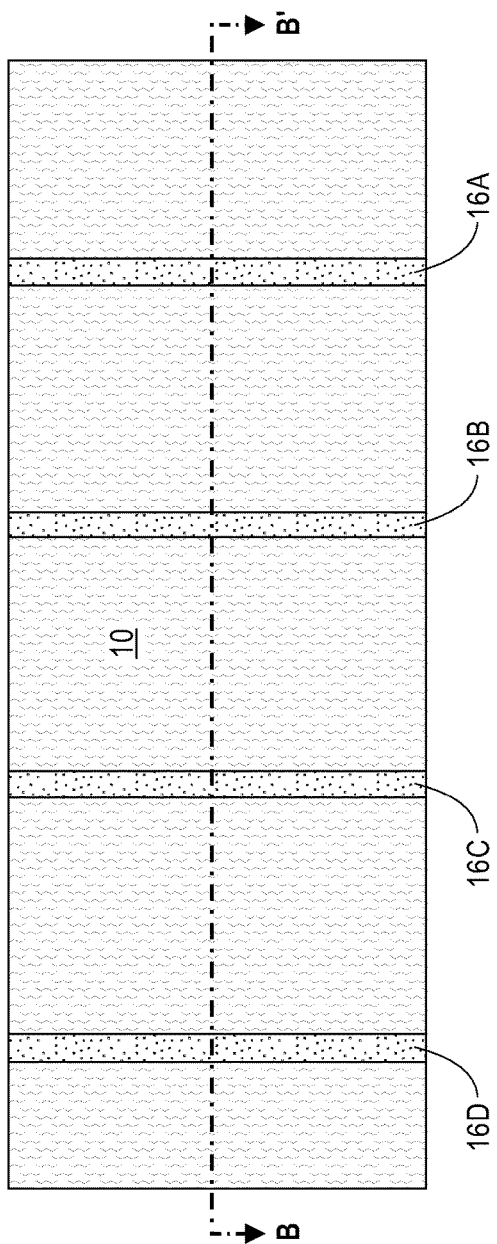
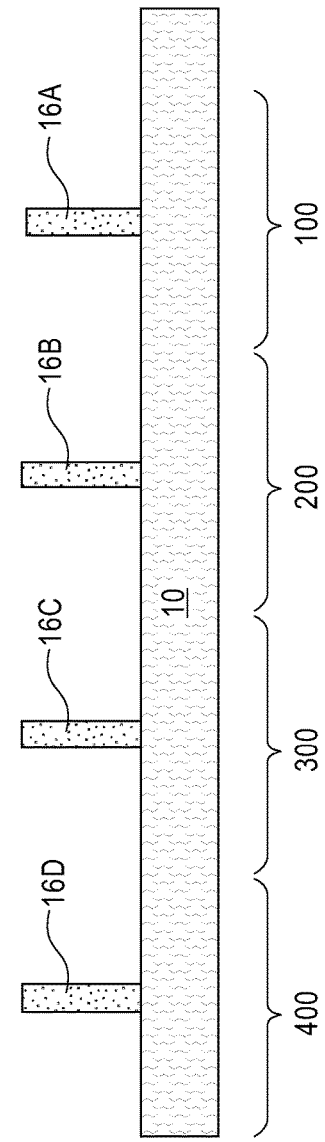

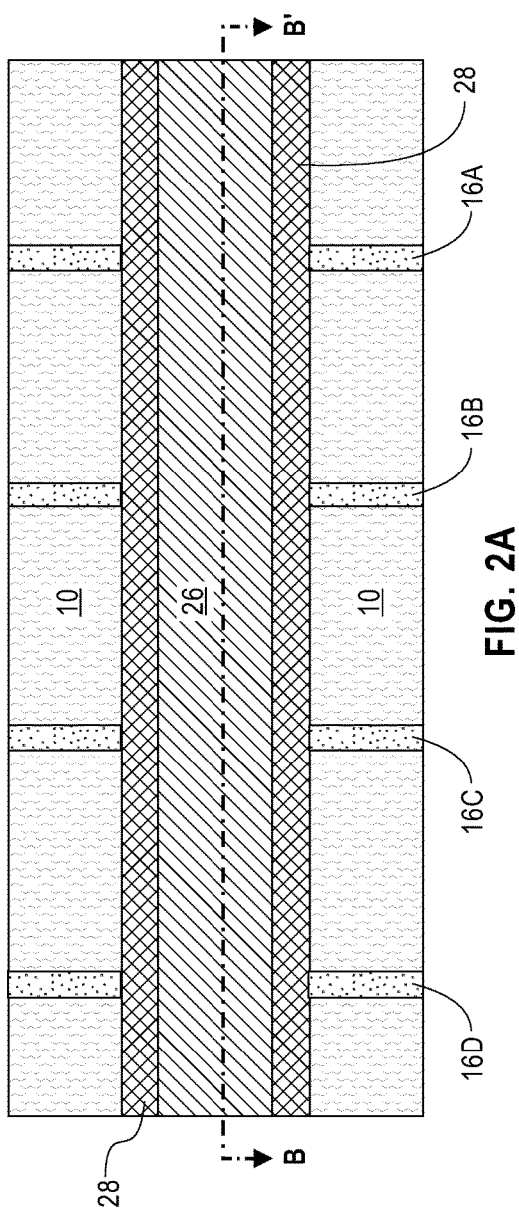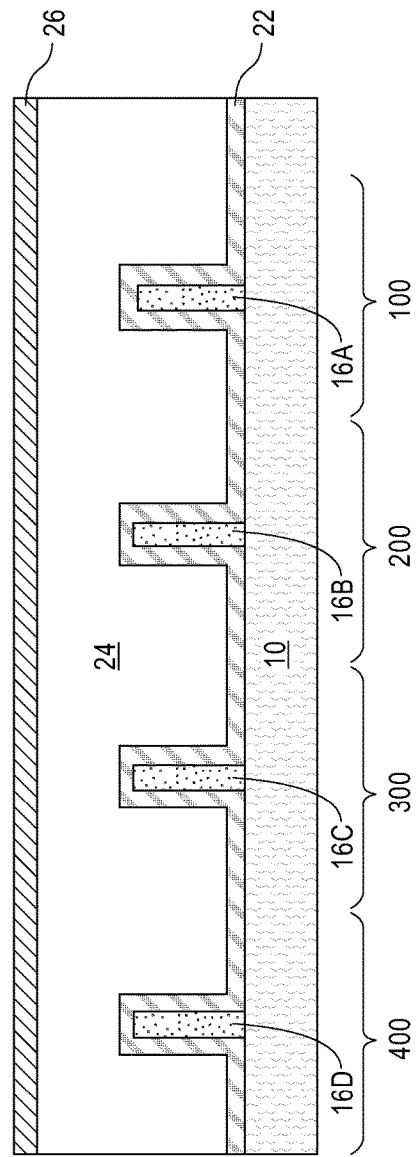

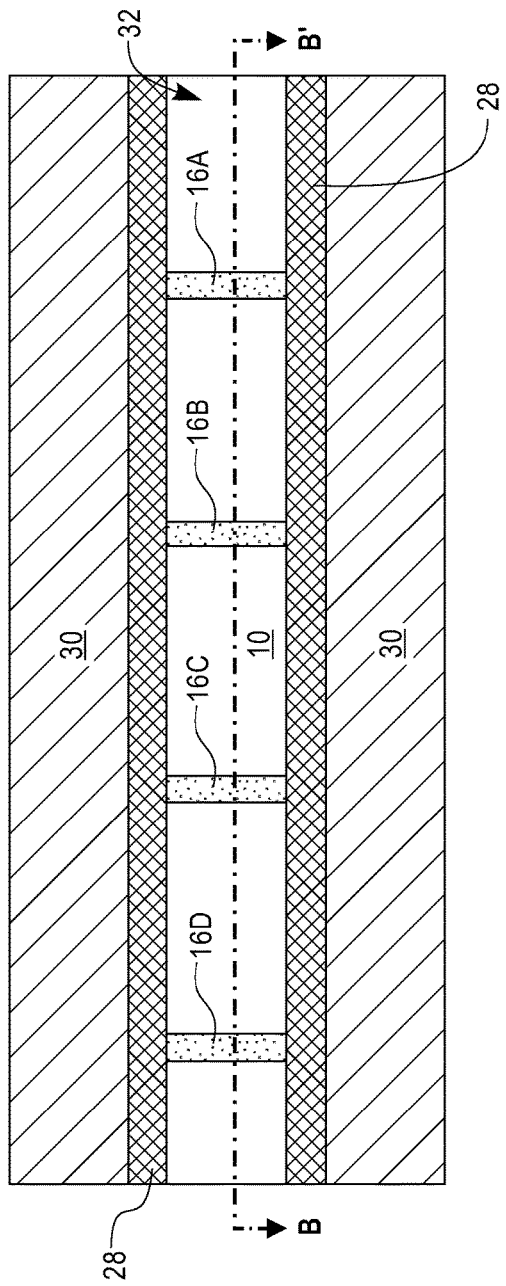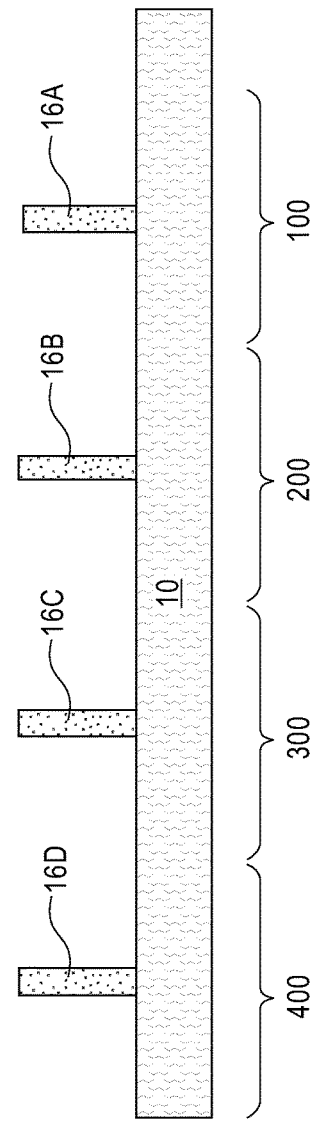
FIG. 4A
FIG. 4B

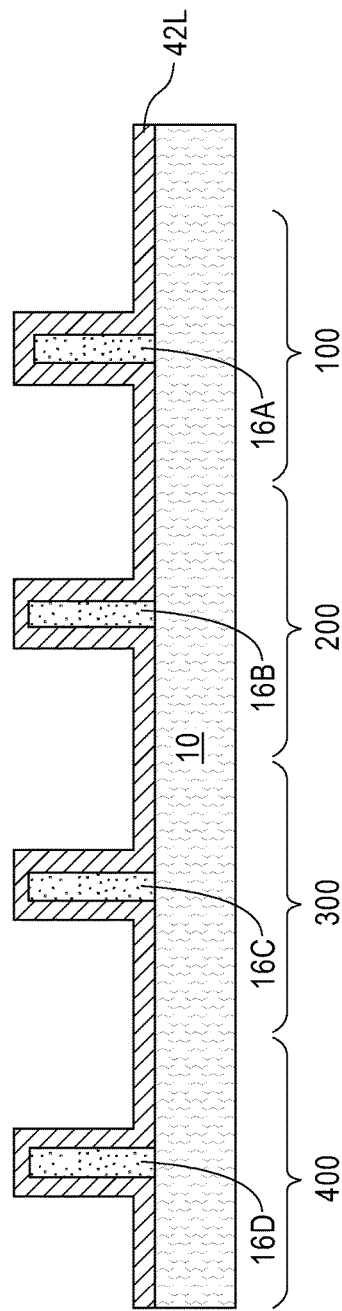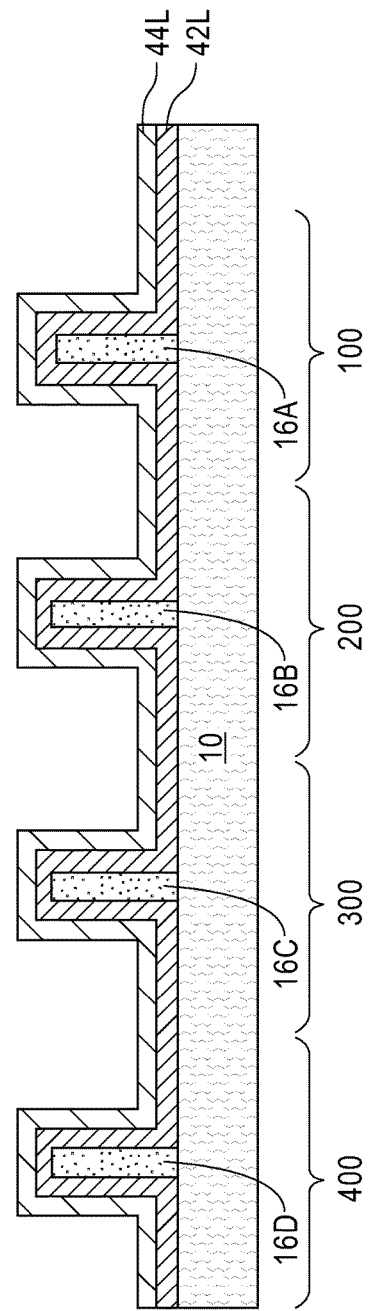

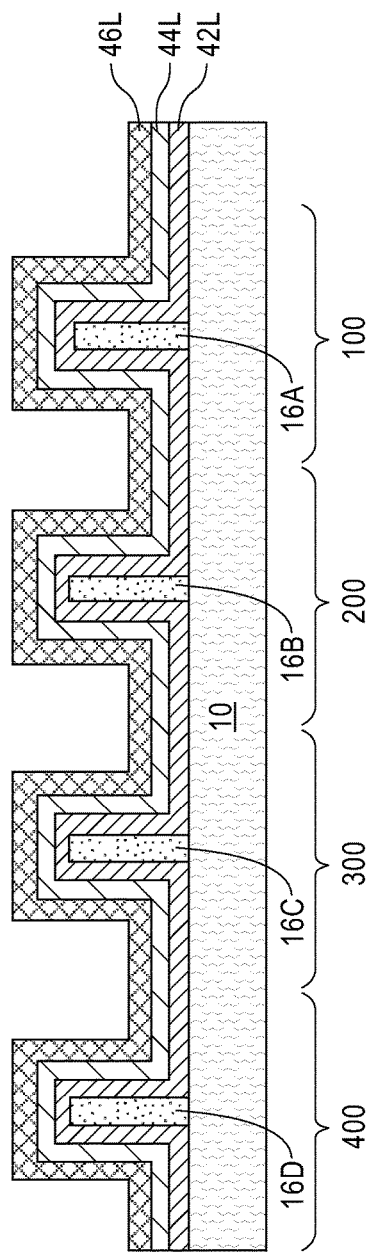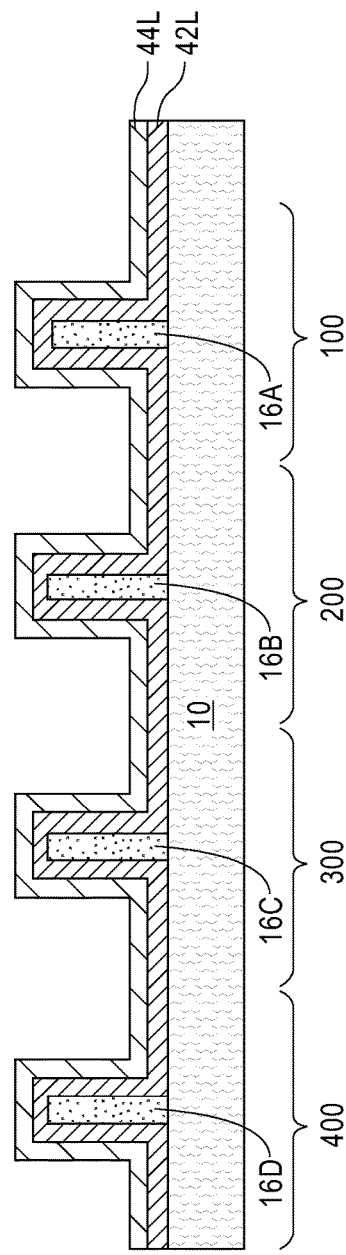

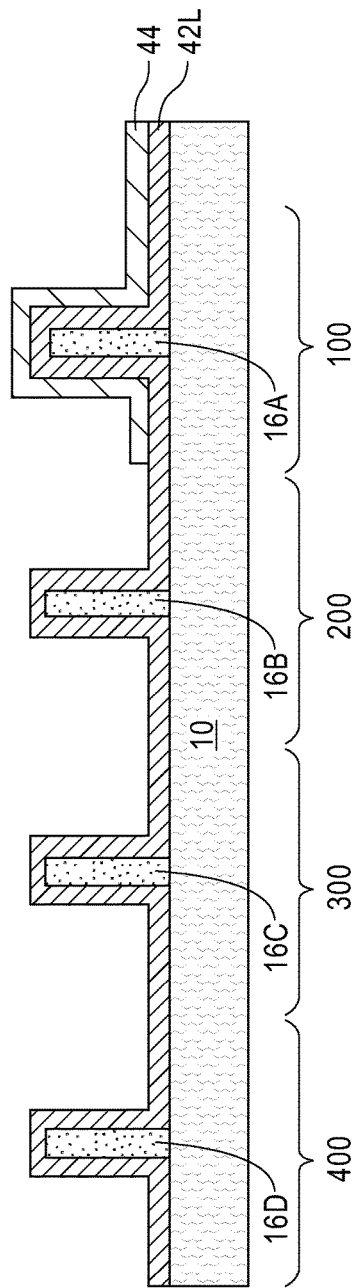
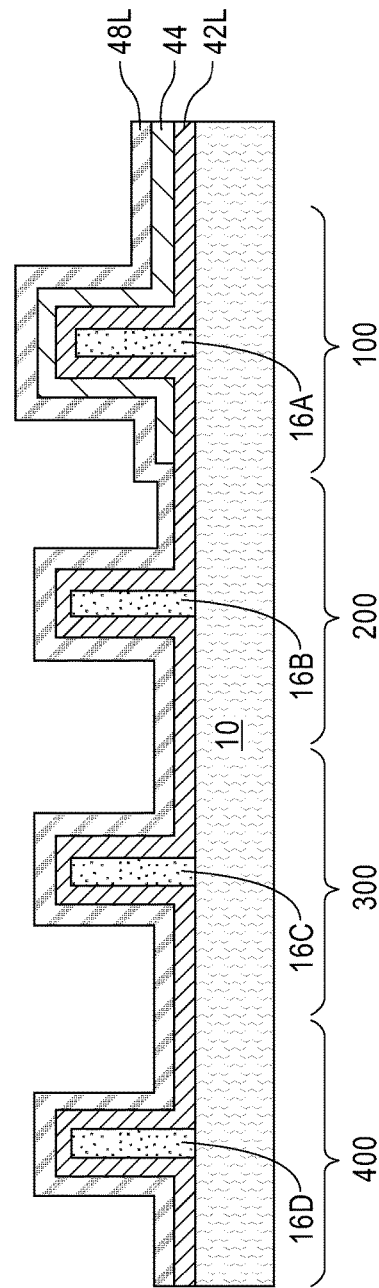

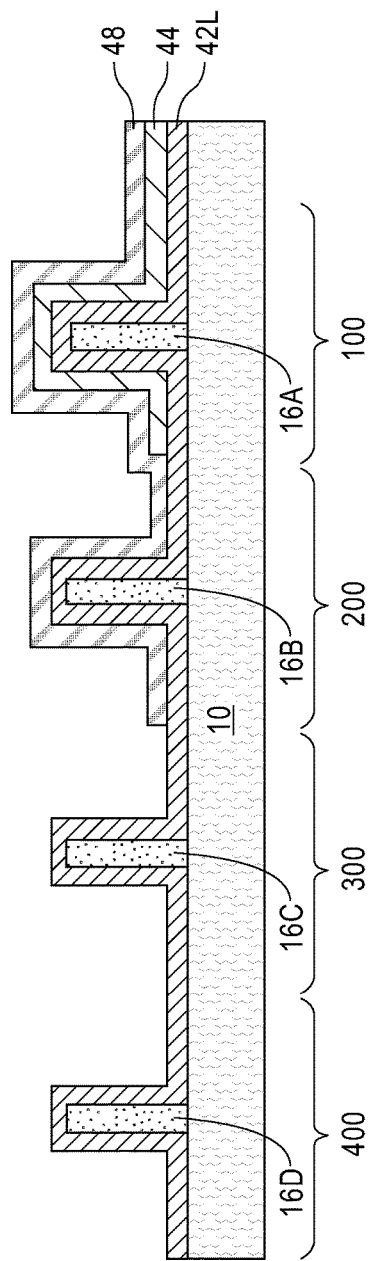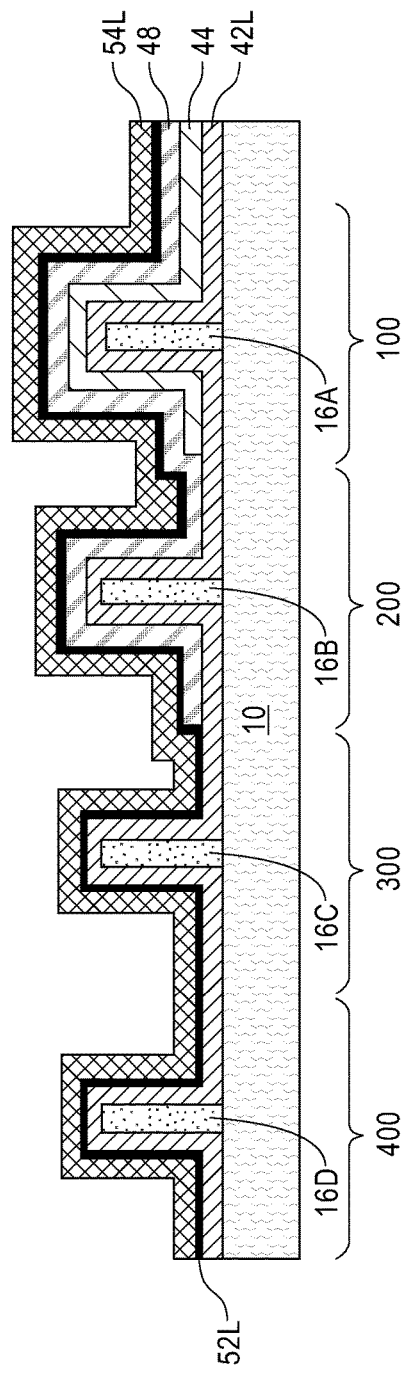

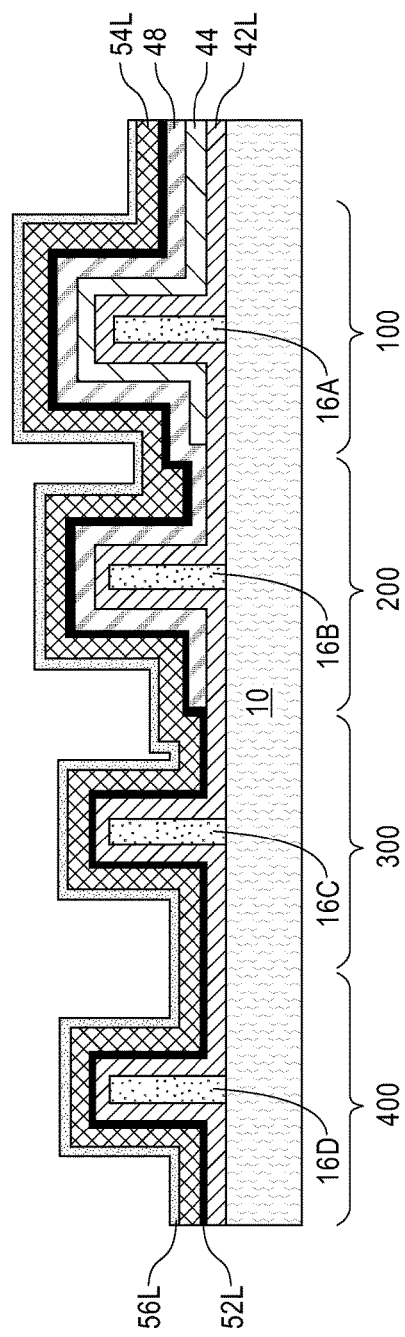
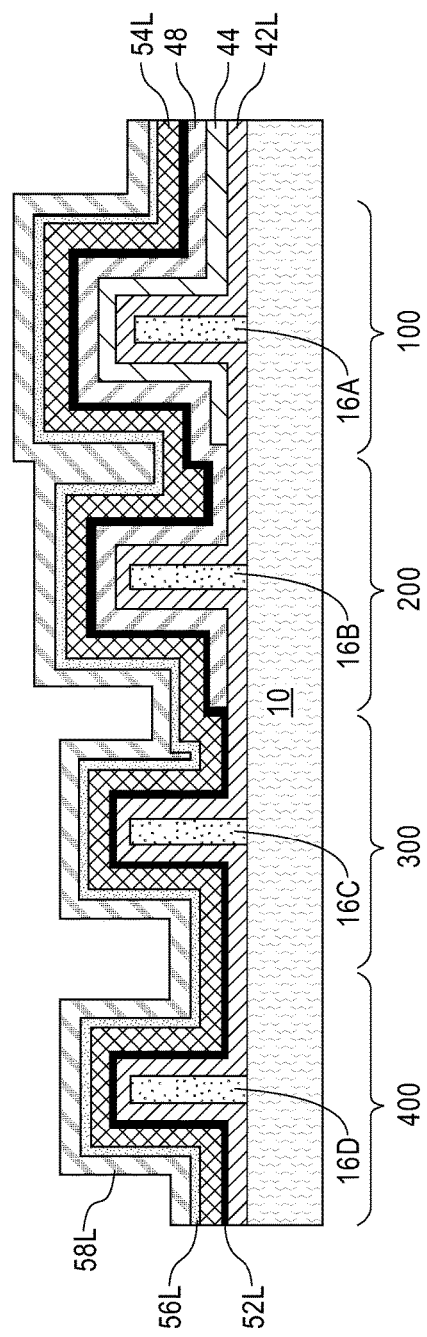

ALTERNATIVE THRESHOLD VOLTAGE SCHEME VIA DIRECT METAL GATE PATTERNING FOR HIGH PERFORMANCE CMOS FINFETS

BACKGROUND

The present application relates to semiconductor structures, and more particularly to field effect transistors (FETs) having multiple metal gates with different threshold voltages and methods of manufacturing the same.

In advanced semiconductor chips, multiple types of field effect transistors (FETs) with different threshold voltages are used to realize circuit function. A challenge, however, associated with integrating different types of transistors is that each type of transistor generally requires a threshold voltage that is different from what the other types of transistors require. For example, static random access memory (SRAM) transistors typically require a higher threshold voltage than logic transistors due to the relatively lower power requirements of SRAM transistors as compared to logic transistors.

In traditional planar FET technology, threshold voltage adjustment can be achieved through channel doping. Specifically, ion implantation is performed to alter the threshold voltage of SRAM transistors relative to logic transistors, and vice versa. However, when the threshold voltage of a device is increased by increasing the doping concentration in the channel region, carrier mobility decreases, and device performances deteriorate. Moreover, the highly-doped ions in the channel region may compensate the ions in the region where a source or a drain region meets the channel region, thus decreasing the doping concentration in such region and increasing the device resistance.

The conventional channel doping approach is not applicable to adjust the threshold voltage of fin FETs (FinFETs). Due to three-dimensional geometry and static electricity of semiconductor fins, channel doping in FinFET technology leads to dopant fluctuations and threshold voltage variation, which in turn causes the degradation of the device performance. Therefore, there remains a need for improved device structure and method that allow better manipulating threshold voltages for different types of FETs without degrading device performance.

SUMMARY

The present application provides multiple FETs having different threshold voltages by direct metal gate patterning. The different threshold voltages are obtained by selectively incorporating metal layers with different work functions in different gate stack portions of a gate stack.

In one aspect of the present application, a semiconductor structure is provided. The semiconductor structure includes at least one first semiconductor fin located in a first device region of a substrate, at least one second semiconductor fin located in a second device region of the substrate, at least one third semiconductor fin located in a third device region of the substrate, and at least one fourth semiconductor fin located in a fourth device region of the substrate and a gate stack straddling over a channel portion of each of the at least one first semiconductor fin, the at least one second semiconductor fin, the at least one third semiconductor, and the at least one fourth semiconductor fin. The gate stack includes a first gate stack portion straddling over the channel portion of the first semiconductor fin. The first gate stack portion includes a first portion of a gate dielectric that is present on sidewalls and a bottom surface of a gate cavity laterally surrounded by an interlevel dielectric (ILD) layer located in the first device region. The gate cavity exposes the channel portion of each of the at least one first semiconductor fin, the at least one second semiconductor fin, the at least one third semiconductor fin, and the at least one fourth semiconductor fin. The first gate stack portion further includes a gate dielectric cap present on the first portion of the gate dielectric, a first portion of a p-type work function metal present on the gate dielectric cap, a first portion of a barrier layer portion present on the first portion of the p-type work functional metal, and a first portion of an n-type work function metal present on the first portion of the barrier layer portion. The gate stack further includes a second gate stack portion straddling over the channel portion of the second semiconductor fin. The second gate stack portion includes a second portion of the gate dielectric located in the second device region, a second portion of the p-type work function metal present on the second portion of the gate dielectric, a second portion of the barrier layer portion present on the second portion of the p-type work functional metal, a second portion of the n-type work function metal present on the second portion of the barrier layer portion, and a first portion of a gate electrode present on the second portion of the n-type work function metal. The gate stack further includes a third gate stack portion straddling over the channel portion of the third semiconductor fin. The gate stack includes a third portion of the gate dielectric located in the third device region, a third portion of the barrier layer portion present on the third portion of the gate dielectric, a third portion of the n-type work function metal present on the third portion of the barrier layer portion, a metal cap present on the third portion of the n-type work function metal, and a second portion of the gate electrode present on the metal cap. Yet further, the gate stack includes a fourth gate stack portion straddling over the channel portion of the fourth semiconductor fin. The fourth gate stack portion includes a fourth portion of the gate dielectric located in the fourth device region, a fourth portion of the barrier layer portion present on the fourth portion of the gate dielectric, a fourth portion of the n-type work function metal present on the fourth portion of the barrier layer portion, and a third portion of the gate electrode present on the fourth portion of the n-type work function metal.

In another aspect of the present application, a method of forming a semiconductor structure is provided. The method includes forming at least one first semiconductor fin located in a first device region of a substrate, at least one second semiconductor fin located in a second device region of the substrate, at least one third semiconductor fin located in a third device region of the substrate, and at least one fourth semiconductor fin located in a fourth device region of the substrate. After forming a gate cavity that is laterally surrounded by an interlevel dielectric (ILD) layer to expose a channel portion of each of the at least one first semiconductor fin, the at least one second semiconductor fin, the at least one third semiconductor fin, and the at least one fourth semiconductor fin, a gate dielectric layer is formed on sidewalls and bottom surfaces of the gate cavity and a topmost surface of the ILD layer. A gate dielectric cap layer is then formed over the gate dielectric layer. Next, a portion of the gate dielectric cap layer is removed from the second, the third and the fourth device regions. Next, a p-type work function metal layer is formed over a portion of the gate dielectric layer exposed in the second, the third and the fourth device regions and a remaining portion of the gate dielectric cap layer located in the first device region. After removing a portion of the p-type work function metal layer from the third and fourth device regions, a barrier layer is formed over a portion of the gate dielectric layer exposed in the third and the fourth device regions and a remaining portion of the p-type work function metal layer located in the first and second device regions. An n-type work function metal layer is formed over the barrier layer. The n-type work function metal layer completely fills a first portion of the gate cavity located in the first device region. After forming a metal cap layer over the n-type work function metal layer, a portion of the metal cap layer is removed from the first, the second and the fourth device regions. Next, a gate electrode layer is formed over portions of the n-type work function metal layer exposed in the first, the second and the fourth device regions and a remaining portion of the metal cap layer located in the third device region, wherein the gate electrode layer completely fills a remaining portion of the gate cavity.

BRIEF DESCRIPTION OF THE DRAWINGS

FIG. 1A is a top view of an exemplary semiconductor structure after forming at least one first semiconductor fin in a first device region of the substrate, at least one second semiconductor fin in a second device region of the substrate, at least one third semiconductor fin in a third device region of the substrate, and at least one fourth semiconductor fin in a fourth device region of the substrate according to an embodiment of the present application.

FIG. 1B is a cross-sectional view of the exemplary semiconductor structure of FIG. 1A along line B-B'.

FIG. 2A is a top view of the exemplary semiconductor structure of FIGS. 1A and 1B after forming a sacrificial gate structure over a channel portion of each of the at least one first semiconductor fin, the at least one second semiconductor fin, the at least one third semiconductor fin, and the at least one fourth semiconductor fin.

FIG. 2B is a cross-sectional view of the exemplary semiconductor structure of FIG. 2A along line B-B'.

FIG. 4A is top view of the exemplary semiconductor structure of FIGS. 3A and 3B after forming a gate cavity to expose the channel portion of each of the at least one first semiconductor fin, the at least one second semiconductor fin, the at least one third semiconductor fin, and the at least one fourth semiconductor fin.

FIG. 4B is a cross-sectional view of the exemplary semiconductor structure of FIG. 4A along line B-B'.

FIG. 5 is a cross-sectional view of the exemplary semiconductor structure of FIG. 4B after forming a gate dielectric layer on a bottom surface and sidewalls of gate cavity and a topmost surface of the ILD layer.

FIG. 6 is a cross-sectional view of the exemplary semiconductor structure of FIG. 5 after forming a gate dielectric cap layer on the gate dielectric layer.

FIG. 7 is a cross-sectional view of the exemplary semiconductor structure of FIG. 6 after forming a sacrificial cap layer on the gate dielectric cap layer.

FIG. 8 is a cross-sectional view of the exemplary semiconductor structure of FIG. 7 after removing the sacrificial cap layer to re-expose the gate dielectric cap layer.

FIG. 9 is a cross-sectional view of the exemplary semiconductor structure of FIG. 8 after patterning the gate dielectric cap layer thereby leaving a gate dielectric cap layer portion only in the first device region.

FIG. 10 is a cross-sectional view of the exemplary semiconductor structure of FIG. 9 after forming a p-type work function metal layer on the gate dielectric cap layer portion and a portion of the gate dielectric layer that is not covered by the gate dielectric cap layer portion.

FIG. 11 is a cross-sectional view of the exemplary semiconductor structure of FIG. 10 after patterning the p-type work function metal layer to remove the p-type work function metal layer from the third and the fourth device regions.

FIG. 12 is a cross-sectional view of the exemplary semiconductor structure of FIG. 11 after forming an n-type work function metal stack including a barrier layer present over a remaining portion of the p-type work function metal layer and a portion of the gate dielectric layer that is not covered by the reaming portion of the p-type work function metal layer and an n-type work function metal layer over the barrier layer.

FIG. 13 is a cross-sectional view of the exemplary semiconductor structure of FIG. 12 after forming an etch stop layer over the n-type work function metal layer.

FIG. 14 is a cross-sectional view of the exemplary semiconductor structure of FIG. 13 after forming a metal cap layer over the etch stop layer.

DETAILED DESCRIPTION

Figure 3A:
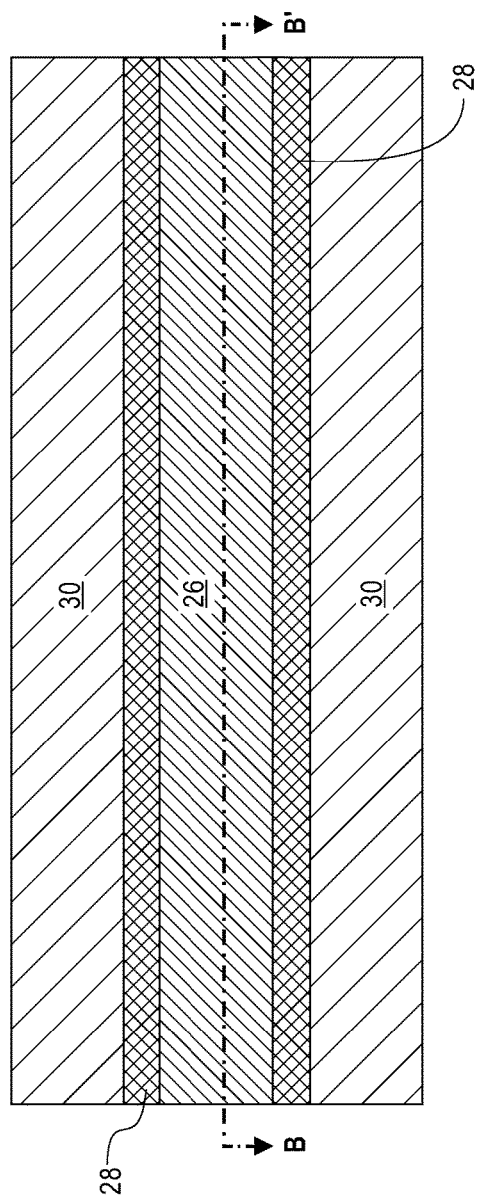
FIG. 3A is a top view of the exemplary semiconductor structure of FIGS. 2A and 2B after forming an interlevel dielectric (ILD) layer over the substrate to laterally surround the sacrificial gate structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIGS. 1A and 1B, an exemplary semiconductor structure that can be employed according to an embodiment of the present application includes a substrate 10 having a plurality of semiconductor fins formed thereon.

The plurality semiconductor fins includes at least one first semiconductor fin 16A formed in a first device region 100 of the substrate, at least one second semiconductor fin 16B formed in a second device region 200 of the substrate, at least one third semiconductor fin 16C formed in a third device region 300 of the substrate, and at least one fourth semiconductor fin 16D formed in a fourth device region of the substrate. In one embodiment, the first and the second device regions can be p-type FinFET (pFinFET) regions and the third and the fourth device regions can be n-type FinFET (nFinFET) region.

In one embodiment, the semiconductor fins 16A, 16B, 16C, 16D can be formed from a bulk substrate including a bulk semiconductor material throughout (not shown). In another embodiment and as shown in FIG. 1, the semiconductor fins 16A, 16B, 16C, 16D and the substrate 10 may be provided from a semiconductor-on-insulator (SOI) substrate, in which the top semiconductor layer of the SOI substrate provides the semiconductor fins 16A, 16B, 16C, 16D and the buried insulator layer provides the substrate 10. The SOI substrate typically includes, from bottom to top, a handle substrate (not shown), a buried insulator layer (i.e., substrate 10) and a top semiconductor layer (not shown).

The handle substrate may include a semiconductor material, such as, for example, Si, Ge, SiGe, SiC, SiGeC, and III/V compound semiconductors. The handle substrate provides mechanical support to the buried insulator layer and the top semiconductor layer. The thickness of the handle substrate can be from 30 μm to about 2 mm, although lesser and greater thicknesses can also be employed.

The buried insulator layer may include a dielectric material such as silicon dioxide, silicon nitride, silicon oxynitride, or a combination thereof. The thickness of the buried insulator layer may be from 50 nm to 200 nm, although lesser and greater thicknesses can also be employed.

The top semiconductor layer may include a semiconductor material which can be Si, Ge, SiGe, SiC, SiGeC, or a III/V compound semiconductor such as, for example, InAs, GaAs, and InP. The semiconductor materials of the top semiconductor layer and the handle substrate may be same or different. Typically, each of the handle substrate and the top semiconductor layer comprises a single crystalline semiconductor material, such as, for example, single crystalline silicon. The top semiconductor layer may or may not be doped with p-type dopants and/or n-type dopants. Examples of p-type dopants include, but are not limited to, boron, aluminum, gallium and indium. Examples of n-type dopants, include but are not limited to, antimony, arsenic and phosphorous. The thickness of the top semiconductor layer can be from 10 nm to 200 nm, although lesser and greater thicknesses can also be employed.

Optionally, a pad layer (not shown) may be deposited on the top semiconductor layer to protect the top semiconductor layer during the subsequent patterning processes. The pad layer may include silicon nitride or a stack of, for bottom to top, a silicon dioxide layer and a silicon nitride layer.

The semiconductor fins 16A, 16B, 16C, 16D may be formed by lithography and etching. The lithographic step includes applying a photoresist layer (not shown) atop the top semiconductor layer or the pad layer, if present, exposing the photoresist layer to a desired pattern of radiation, and developing the exposed photoresist layer utilizing a conventional resist developer. The etching process may be a dry etch and/or a wet chemical etch. Illustrative examples of suitable dry etching processes that can be used in the present application include reactive ion etch (RIE), ion beam etching, plasma etching or laser ablation. Typically, a RIE process is used. The etching process transfers the pattern from the patterned photoresist layer to the top semiconductor layer or first to the pad layer, if present, and thereafter to the underlying top semiconductor layer to provide the semiconductor fins 16A, 16B, 16C, 16D utilizing the buried insulator layer 12 as an etch stop. After forming the semiconductor fins 16A, 16B, 16C, 16D, the patterned photoresist layer can be removed utilizing a conventional resist stripping process such as, for example, ashing. Alternatively, the semiconductor fins 16A, 16B, 16C, 16D may also be formed utilizing a sidewall image transfer (SIT) process. In a typical SIT process, spacers are formed on sacrificial mandrels. The sacrificial mandrels are removed and the remaining spacers are used as an etch mask to etch the top semiconductor layer. The spacers are then removed after the semiconductor fins 16A, 16B, 16C, 16D have been formed.

In one embodiment of the present application, the first, the second, the third and the fourth semiconductor fins 16A, 16B, 16C, 16D are formed substantially parallel to each other. Each of the semiconductor fins 16A, 16B, 16C, 16D may have a height ranging from 5 nm to 150 nm, with a height ranging from 10 nm to 50 nm being more typical. Each of the semiconductor fins 16A, 16B, 16C, 16D may have a width ranging from 3 nm to 50 nm, with a width ranging from 10 nm to 20 nm being more typical.

In some embodiments of the present application and when the pad layer is present, the pad layer that remains atop the semiconductor fins 16A, 16B, 16C, 16D can be removed at this stage. The removal of the remaining non-etched portion of pad layer can be achieved by performing a selective etching process or by utilizing a planarization process such as chemical mechanical planarization (CMP). In some embodiments, a portion of the pad layer can remain atop each of the semiconductor fins 16A, 16B, 16C, 16D.

Referring to FIGS. 2A and 2B, at least one sacrificial gate structure is formed over a portion of each of the semiconductor fins 16A, 16B, 16C, 16D. The term "sacrificial gate structure" as used herein refers to a placeholder structure for a functional gate structure to be subsequently formed. The "functional gate structure" as used herein refers to a permanent gate structure used to control output current (i.e., flow of carriers in the channel) of a semiconducting device through electrical fields.

The sacrificial gate structure includes a sacrificial gate stack and a gate spacer 28 formed on each sidewall of the sacrificial gate stack. Each sacrificial gate stack includes, from bottom to top, a sacrificial gate dielectric 22, a sacrificial gate conductor 24 and a sacrificial gate cap 26. The sacrificial gate stack (22, 24, 26) can be formed by first providing a material stack (not shown) that includes, from bottom to top, a sacrificial gate dielectric layer, a sacrificial gate conductor layer and a sacrificial gate cap layer over the semiconductor fins 16A, 16B, 16C, 16D and the substrate 10. In some embodiments of the present application, the sacrificial gate dielectric layer can be omitted. When present, the sacrificial gate dielectric layer includes a dielectric material such as an oxide or a nitride. In one embodiment, the sacrificial gate dielectric layer may include silicon dioxide, silicon nitride, or silicon oxynitride. The sacrificial gate dielectric layer can be formed by a conventional deposition process, including but not limited to, chemical vapor deposition (CVD) or physical vapor deposition (PVD). The sacrificial gate dielectric layer can also be formed by conversion of a surface portion of each of the semiconductor fins 16A, 16B, 16C, 16D. The sacrificial gate dielectric layer that is formed may have a thickness from 1 nm to 10 nm, although lesser and greater thicknesses can also be employed.

The sacrificial gate conductor layer may include a semiconductor material such as polysilicon or a silicon-containing semiconductor alloy such as a silicon-germanium alloy. Alternatively, the sacrificial gate conductive layer may include a metal such as, for example W. The sacrificial gate layer can be formed using CVD or plasma enhanced chemical vapor deposition (PECVD). The sacrificial gate conductor layer that is formed may have a thickness from 20 nm to 300 nm, although lesser and greater thicknesses can also be employed.

The sacrificial gate cap layer may include a dielectric material such as an oxide, a nitride or an oxynitride. In one embodiment, the sacrificial gate cap layer is comprised of silicon nitride. The sacrificial gate cap layer can be formed utilizing a conventional deposition process including, for example, CVD or PECVD, PVD, or atomic layer deposition (ALD). The sacrificial gate cap layer that is formed may have a thickness from 10 nm to 200 nm, although lesser and greater thicknesses can also be employed.

The material stack can then be patterned by lithography and etching to form the sacrificial gate stack (22, 24, 26). Specifically, a photoresist layer (not shown) is applied over the topmost surface of the material stack and is lithographically patterned by lithographic exposure and development. The pattern in the photoresist layer is transferred into the material stack by an etch, which can be an anisotropic etch such as RIE. The remaining portion of the material stack after the pattern transfer constitutes the sacrificial gate stack (22, 24, 26). The patterned photoresist layer may be subsequently removed by, for example, ashing.

The gate spacer 28 may include a dielectric material such as, for example, an oxide, a nitride, an oxynitride, or any combination thereof. For example, the gate spacer 28 may be composed of silicon nitride, silicon boron carbon nitride, or silicon carbon oxynitride. The gate spacer 28 can be formed by first providing a conformal gate spacer material layer (not shown) on exposed surfaces of the sacrificial gate stacks (22, 24, 26) and the substrate 10 and then etching the conformal gate spacer material layer to remove horizontal portions of the conformal gate spacer material layer. The conformal gate spacer material layer can be provided by a deposition process including, for example, CVD, PECVD, ALD or PVD. The etching of the conformal gate spacer material layer may be performed by a dry etch process such as, for example, RIE. The remaining portions of the conformal gate spacer material layer constitute the gate spacer(s) 28. The width of each gate spacer 28, as measured at the base of the gate spacer 28 can be from 5 nm to 100 nm, although lesser and greater widths can also be employed.

After the sacrificial gate structure is formed, a first source region and a first drain region (collectively referred to as first source/drain regions) (not shown) may be formed on opposite sides of the sacrificial gate structure in the first and the second device regions 100, 200 of the substrate 10, while a second source region and a second drain region (collectively referred to as second source/drain regions) (not shown) may be formed on opposite sides of the sacrificial gate structure in the third and the fourth device regions 300, 400 of the substrate 10.

In one embodiment of the present application, the first and second source/drain regions are planar source/drain regions located within the semiconductor fins 16A, 16B, 16C, 16D, respectively. The planar source/drain regions can be formed utilizing ion implantation. For nFinFETs, the source/drain regions can be made by implanting an n-type dopant, while for pFinFETs, the source/drain regions can be made by implanting a p-type dopant. Exemplary n-type dopants include, but are not limited to, P, As or Sb. Exemplary p-type dopants include, but are not limited to, B, Al, Ga or In. An activation anneal can be subsequently performed to activate the implanted dopants in the source/drain regions.

In another embodiment of the present application, the first and second source/drain regions are raised source/drain regions located on top and sidewall surfaces of the semiconductor fins 16A, 16B, 16C, 16D, respectively. The raised source/drain regions may be formed by selective epitaxy. During the selective epitaxy process, the deposited semiconductor material grows only on exposed semiconductor surfaces, i.e., exposed surfaces of the semiconductor fins 16A, 16B, 16C, 16D on opposite sides of the sacrificial gate structure and does not grow on dielectric surfaces, such as surfaces of the sacrificial gate cap 26, the gate spacer 28 and the substrate 10.

The semiconductor material of the raised source/drain regions can be deposited as an intrinsic semiconductor material, or can be deposited with in-situ doping. If the semiconductor material is deposited as an intrinsic semiconductor material, the raised source/drain regions can be subsequently doped (ex-situ) utilizing ion implantation, gas phase doping or dopant out diffusion from a sacrificial dopant source material. In one embodiment, the semiconductor material for nFinFETs may include Si:C, while the semiconductor material for pFinFETs may include SiGe.

Figure 3B:
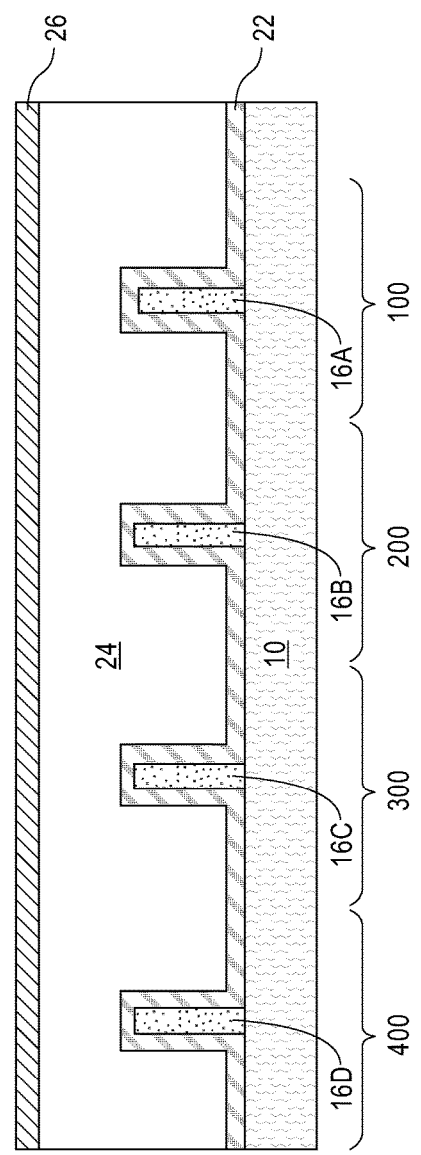
FIG. 3B is a cross-sectional view of the exemplary semiconductor structure of FIG. 3A along line B-B'.

Referring to FIGS. 3A and 3B, an interlevel dielectric (ILD) layer 30 is formed over the substrate 10 to laterally surround the sacrificial gate structure. The ILD layer 30 may include a dielectric material such as undoped silicon oxide, doped silicon oxide, silicon nitride, porous or non-porous organosilicate glass, porous or non-porous nitrogen-doped organosilicate glass, or a combination thereof. The ILD layer 30 can be formed by CVD, ALD, PVD or spin coating. The thickness of the ILD layer 30 can be selected so that an entirety of the top surface of the ILD layer 30 is formed above the top surface of the sacrificial gate cap 26. The ILD layer 30 can be subsequently planarized, for example, by CMP and/or a recess etch employing the sacrificial gate cap 26 as an etch stop. After the planarization, the ILD layer 30 has a top surface coplanar with the top surface of the sacrificial gate cap 26.

Referring to FIGS. 4A and 4B, the sacrificial gate stack (22, 24, 26) in the sacrificial gate structure is removed to provide a gate cavity 32. The sacrificial gate stack (22, 24, 26) can be removed selectively to the substrate 10, the semiconductor fins 16A, 16B, 16C, 16D, the gate spacers 28 and the ILD layer 30 by at least one etch, which can be a dry etch and/or a wet chemical etch. The gate cavity 32 occupies a volume from which the sacrificial gate stack (22, 24, 26) is removed and is laterally confined by inner sidewalls of the gate spacers 28. The gate cavity 32 exposes the channel portion of each of the semiconductor fins 16A, 16B, 16C, 16D.

Referring to FIG. 5, a gate dielectric layer 42L is conformally deposited on a bottom surface and sidewalls of the gate cavity 32 and the topmost surface of the ILD layer 30. The gate dielectric layer 42L may include a high-k gate material such as, for example, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, or an alloy thereof. Each value of x is independently from 0.5 to 3 and each value of y is independently from 0 to 2. As used herein, the term "high-k"

means a material having a dielectric constant that is greater than 8.0. In one embodiment, the gate dielectric layer 42L includes $HfO_2$. The gate dielectric layer 42L may be formed by a conventional deposition process, including but not limited to, CVD, PVD, ALD, molecular beam epitaxy (MBE), ion beam deposition, electron beam deposition, and laser assisted deposition. The gate dielectric layer 42L that is formed may have a thickness ranging from 0.9 nm to 6 nm, with a thickness ranging from 1.0 nm to 3 nm being more typical. The gate dielectric layer 42L may have an effective oxide thickness on the order of or less than 1 nm.

Although not specifically shown in FIG. 5, prior to the formation of the gate dielectric layer 42L, an interfacial layer may be formed on all semiconductor surfaces, e.g., sidewalls and top surfaces of the semiconductor fins 16A, 16B, 16C, 16D exposed in the gate cavity 32. The interfacial layer may be composed of an oxide, such as silicon dioxide, or oxynitride, such as silicon oxynitride. The interfacial layer may be formed utilizing a conventional thermal growing technique including, for example, oxidation or oxynitridation, or a wet chemical oxidation. The interfacial layer may has thickness from 0.5 nm to 5 nm, although lesser and greater thicknesses can also be employed. The interfacial layer facilitates the nucleation of the gate dielectric layer 42L formed thereon.

Referring to FIG. 6, a gate dielectric cap layer 44L is conformally deposited over the gate dielectric layer 42L for work function tuning. The gate dielectric cap layer 44L may include a dielectric material which is selected to ultimately tune the first effective work function of a first gate stack later formed in the first device region 100. In one embodiment, the gate dielectric cap layer 44L may include a metal nitride such as, for example, TiN. The gate dielectric cap layer 44L may be formed by a suitable deposition process such as, for example, CVD, PVD, or ALD. The gate dielectric cap layer 44L that is formed may have a thickness ranging from 10 Å to 25 Å, although lesser and greater thicknesses can also be employed.

Referring to FIG. 7, a sacrificial cap layer 46L is conformally deposited on the gate dielectric cap layer 44L. The sacrificial cap layer 46L acts an oxygen barrier to prevent oxidation of the semiconductor fins 16A, 16B, 16C, 16D during an annealing process that is subsequently performed to increase the work function of the material of the gate dielectric cap layer 44L. In one embodiment, the sacrificial cap layer 46L may include amorphous silicon or polycrystalline silicon. The sacrificial cap layer 46L may be formed by CVD, PVD, or ALD. The thickness of the sacrificial cap layer may be from 2 nm to 100 nm, although lesser and greater thicknesses can also be employed.

An anneal is then performed to improve the reliability of the gate dielectric layer 42L as well as change the work function of the gate dielectric cap layer 44L. The anneal may be carried out in an ambient atmosphere containing $N_2$ at a temperature from 600° C. to 1100° C. using rapid thermal annealing (RTA) or laser spike annealing (LSA). A furnace anneal may also be used.

Referring to FIG. 8, the sacrificial cap layer 46L is removed selective to the gate dielectric cap layer 44L. The sacrificial cap layer 46L may be removed by a dry etch which can be RIE or a wet chemical etch. In one embodiment, the sacrificial cap layer 46L may be removed by an ammonia containing chemistry without detrimentally affecting the work function of the underlying gate dielectric cap layer 44L. The removal of the sacrificial cap layer 46L re-exposes the gate dielectric cap layer 44L.

In some embodiments of the present application, after removing the sacrificial cap layer 46L, an optional sacrificial hardmask layer (not shown) is deposited over the gate dielectric cap layer 44L to thicken the gate dielectric cap layer 44L in order to ensure a good patternablity of the gate dielectric cap layer 44L during the patterning process subsequently performed. The sacrificial hardmask layer may include TiN and may be deposited to a thickness from 10 Å to 20 Å by CVD, PVD or ALD.

Referring to FIG. 9, the gate dielectric cap layer 44L is selectively removed from the second, the third and the fourth device regions 200, 300, 400, the gate dielectric cap layer 44L thus remains only in the first device region 100. A mask layer (not shown) is applied over the gate dielectric cap layer 44L, or the sacrificial hardmask layer, if present and lithographically patterned so that a patterned mask layer (not shown) covers the first device region 100, while exposing a portion of the gate dielectric cap layer 44L in the second, the third and the fourth device regions 200, 300, 400. The exposed portion of the gate dielectric cap layer 44L or the exposed portion of the sacrificial hardmask layer, if present and an underlying portion of the gate dielectric cap layer 44L is removed selective to the gate dielectric layer 42L by an etch, which can be a wet chemical etch or a dry etch. The patterned mask layer can then be removed, for example, by a $N_2/H_2$-based plasma etching process. A remaining portion of the sacrificial hardmask layer, if present, may be removed by a wet chemical etch, a dry etch or a combination thereof. The remaining portion of the gate dielectric cap layer 44L in the first device region 100 is herein referred to as a gate dielectric cap layer portion 44. The removal of the gate dielectric cap layer 44L from the second, the third and the fourth device regions 200, 300, 400 re-exposes a portion of the gate dielectric layer 42L in these regions.

Referring to FIG. 10, a p-type work function metal layer 48L is conformally deposited on the exposed portion of the gate dielectric layer 42L and the gate dielectric cap layer portion 44. The p-type work function metal layer 48L includes a p-type work function metal having a work function that effectuates a p-type threshold voltage shift. As used herein, a "p-type work function metal layer" is a metal layer that effectuates a p-type threshold voltage shift. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. The work function of the p-type work function metal layer 48L may range from 4.6 eV to 5.0 eV. In one embodiment, the p-type work function metal layer 48L may include TiN. The p-type work function metal layer 48L may be formed by CVD, PVD, or ALD. The p-type work function metal layer 48L that is formed may have a thickness ranging from 1 nm to 6 nm, although lesser and greater thicknesses can also be employed. The p-type work function metal layer 48L can be deposited by using different temperatures, different precursors, and different methods, depending on the threshold voltage and gate resistance needed for gate stack portions later formed in the pFinFET region (i.e., the first and the second device regions 100, 200). In one embodiment, the p-type work function metal layer 48L is deposited at a relatively high temperature ranging from 420° C. to 500° C. to obtain a p-type work function metal layer 48 with a low work function. As a result, the first gate stack portion later formed in the first device region 100 can have a threshold voltage lower than that of a second gate stack portion later formed in the second device 200.

Referring to FIG. 11, the p-type work function metal layer 48L is selectively removed from the nFinFET region (i.e., the third and the fourth device regions 300, 400), the p-type function metal layer 48L thus remains only in the pFinFET region (100, 200). A mask layer (not shown) is applied over the p-type work function metal layer 48L and lithographically patterned so that a patterned mask layer (not shown) covers the pFinFET region (100, 200), while exposing a portion of the p-type work function metal layer 48L in the nFinFET region (300, 400). The exposed portion of the p-type work function metal layer 48L is removed selective to the gate dielectric layer 42L by an etch, which can be a wet chemical etch or a dry etch. The patterned mask layer can then be removed, for example, by a $N_2/H_2$-based plasma etching process. The remaining portion of the p-type work function metal layer 48L in the pFinFET region is herein referred to as a p-type work function metal layer portion 48. The removal of the p-type work function metal layer 48L from the nFinFET region (300, 400) re-exposes a portion of the gate dielectric layer 42L in the third and fourth device regions 300, 400.

Referring to FIG. 12, an n-type work function metal stack including, from bottom to top, a barrier layer 52L and an n-type work function metal layer 54L is formed over the p-type work function metal layer portion 48 and the exposed portion of the gate dielectric layer 42L. The barrier layer 52L that is conformally deposited over the p-type work function metal layer portion 48 and the exposed portion of the dielectric layer 42L prevents an interaction between the gate dielectric layer 42L and an n-type work function metal layer 54L formed thereon. The barrier layer 52L may include a metal nitride, for example, TiN or TaN and may be deposited to a thickness of, for example, about 10 Å using a suitable deposition process, such as, for example, CVD, PVD, or ALD.

Above the barrier layer 52L is conformally deposited an n-type work function metal layer 54L. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. The n-type work function metal layer 54L includes an n-type work function metal having a work function which may range from 4.1 eV to 4.5 eV. The n-type work function metal layer 54L may include TiAlC, TaAlC, TiAl, Ti, or Al. The n-type work function metal layer 54L may be formed by CVD, PVD, or ALD. The n-type work functional material layer 54L that is formed may have a thickness ranging from 1 nm to 7 nm. In one embodiment, the thickness of the n-type work function metal layer 54L is chosen such that the portion of the gate cavity 32 in the first device region 100 is completely filled by the n-type work function metal layer 54L, while remaining portions of the gate cavity 32 in the second, the third and the fourth device regions 200, 300, 400 remain partially filled.

Referring to FIG. 13, an etch stop layer 56L is conformally deposited over the n-type work function metal layer 54L utilizing CVD or ALD. The etch stop layer 56L typically includes a material that exhibits a greater etch selectivity than the metal of the n-type work function metal layer 54L to prevent the over-etching of the n-type work function metal layer 54L during the patterning process subsequently performed. In one embodiment, the etch stop layer 56L is composed of TaN. The thickness of the etch stop layer 56L can be from 10 Å to 15 Å, although lesser and greater thicknesses can be employed. In some embodiments, the formation of the etch stop layer 56L is optional can be omitted in cases where the n-type work function metal layer 54L can provide an etch selectivity sufficient to permit the selective removal of the n-type work function metal layer 54L.

Referring to FIG. 14, a metal cap layer 58L is conformally deposited over the n-type work function metal layer 54L or the etch stop layer 56L, if present. The metal cap layer 58L protects the metal of underlying n-type work function metal layer 54L from the ambient and eliminates the adverse effects of the subsequent fabrication processes, such as the deposition of an adhesion layer and a gate electrode layer, on the work function of the n-type work function metal layer 54L. The metal cap layer 58L thus also effectuates an n-type threshold voltage shift. In one embodiment, the metal cap layer 58L is composed of TiN. The metal cap layer 58L may be formed by CVD or ALD and may have a thickness from 10 Å to 30 Å. The thickness of the metal cap layer 58L is configured such that the subsequent fabrication processes has less effect on the work function of the n-type work function metal layer 54L. As a result, a lower threshold voltage can be achieved for a third gate stack portion later formed in the third device region 300.

In one embodiment, the barrier layer 52L, the n-type work function metal layer 54L, the etch stop layer 56L, if present, and the metal cap layer 58L may be deposited in-situ, i.e. without air-break between deposition of these layers.

Figure 15:
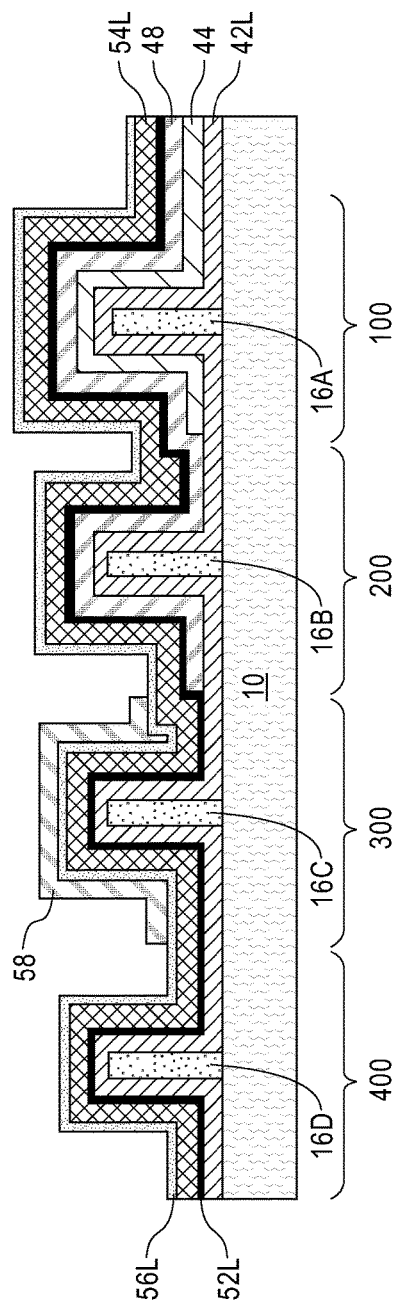
FIG. 15 is a cross-sectional view of the exemplary semiconductor structure of FIG. 14 after patterning the metal cap layer thereby leaving a metal cap layer portion only in the third device region.

Referring to FIG. 15, the metal cap layer 58L is selectively removed from the fourth device region 400 and the pFinFET region (100, 200), the metal cap layer 58L thus remains only in the third device region 300. A mask layer (not shown) is applied over the metal cap layer 58L and lithographically patterned so that a patterned mask layer (not shown) covers the third device region 300, while exposing portions of the metal cap layer 58L in the pFinFET region (100, 200) and the fourth device region 400. The exposed portions of the metal cap layer 58L are removed selective to the n-type work function metal layer 54L or the etch stop layer 56L, if present by an etch, which can be a wet chemical etch or a dry etch. The patterned mask layer can then be removed, for example, by a $N_2/H_2$-based plasma etching process. The remaining portion of the metal cap layer 58L in the third device region 300 is herein referred to as a metal cap layer portion 58. The removal of the metal cap layer 58L from the pFinFET region (100, 200) and the fourth device region 400 of the nFinFET region (300, 400) re-exposes portions of the n-type work function metal layer 54L or the etch stop layer 56L, if present in the first, the second and the fourth device regions 100, 200, 400. The removal of the metal cap layer 58L from the fourth device region 400 changes the work function of the underlying n-type work function metal layer 54L that defines a threshold voltage for a fourth gate stack portion later formed in the fourth device 400. In addition and because the metal cap layer 58L is no long preset in the fourth device region 400, the subsequent fabrication processes may further affect the work function of the portion of the n-type work function metal layer 54L exposed in the fourth device region 400. As a result, the fourth gate stack portion later formed in the fourth device region 400 has a higher threshold voltage than that of the third gate stack portion later formed the third device region 300.

Figure 16:
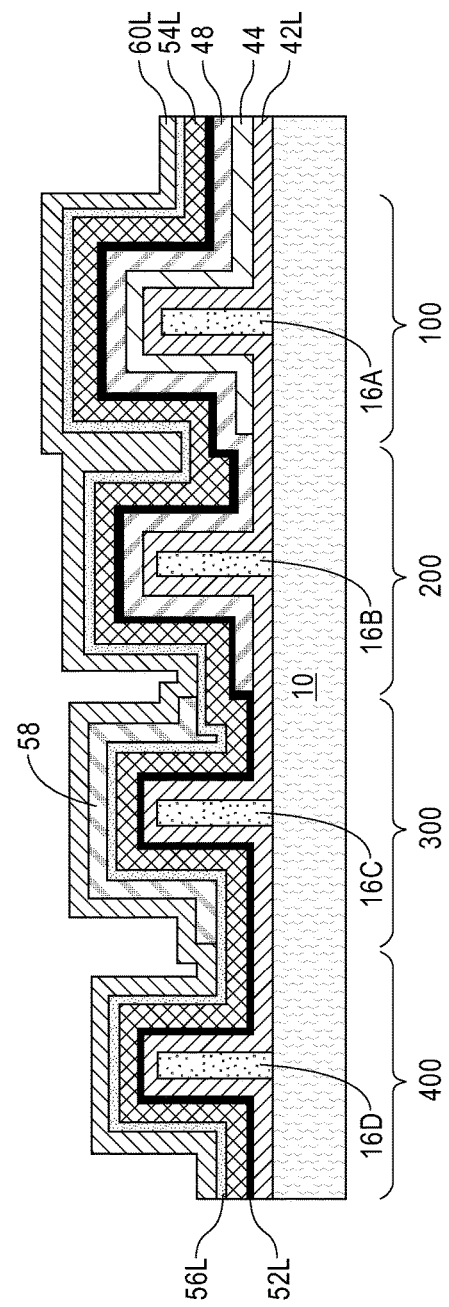
FIG. 16 is a cross-sectional view of the exemplary semiconductor structure of FIG. 15 after forming an adhesion layer over the metal cap layer portion and a portion of the etch stop layer that is not covered by the metal cap layer portion.

Referring to FIG. 16, an adhesion layer 60L is conformally deposited by CVD, PVD or ALD over the metal cap layer potion 58, and the n-type work function metal layer 54L or the etch stop layer 56L, if present. The adhesion layer 60 provides good adhesion between the n-type work function metal layer 54L or the etch stop layer 56L, if present and a gate electrode layer subsequently formed. The adhesion layer 60 may include a metal, such as, for example, Ti, TiN, or TiW. The thickness of the adhesion layer 60L is configured to define the work function of a fourth gate stack formed in the fourth device region 400. The adhesion layer 60L may have a thickness from about 5 Å to 40 Å, although lesser and greater thicknesses can also be employed. In some embodiments of the present application, the adhesion layer 60L can be omitted.

Figure 17:
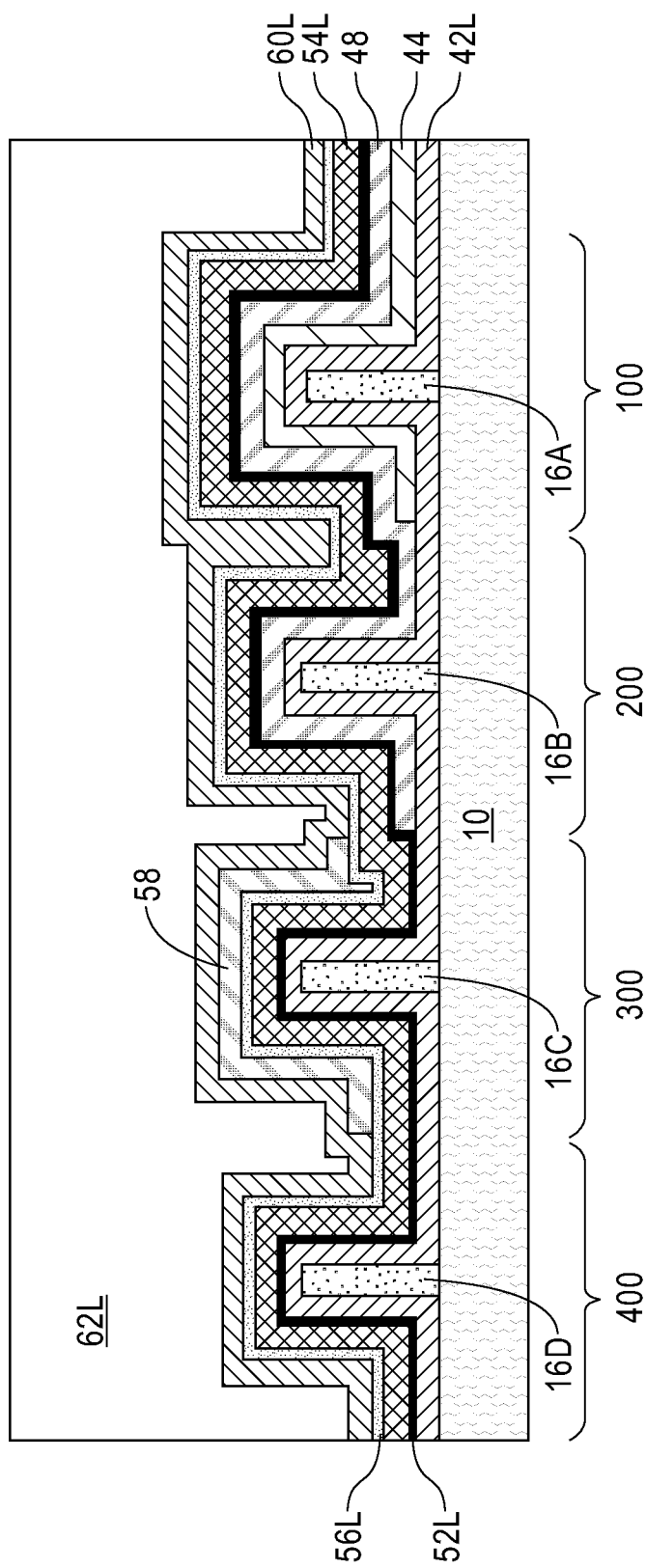
FIG. 17 is a cross-sectional view of the exemplary semiconductor structure of FIG. 16 after forming a gate electrode layer to fill a remaining volume of the gate cavity.

Referring to FIG. 17, a gate electrode layer 62L is deposited in the gate cavity 32 to completely fill a remaining volume of the gate cavity 32. The gate electrode layer 62L may include any conductive material including, for example, doped polysilicon, Al, Au, Ag, Cu, Co or W. The gate electrode layer 62L may be formed by CVD, PVD, or ALD. The gate electrode layer 62L is deposited to a thickness so that a topmost surface of the gate electrode layer 62L is located above the topmost surface of ILD layer 30.

Figure 18:
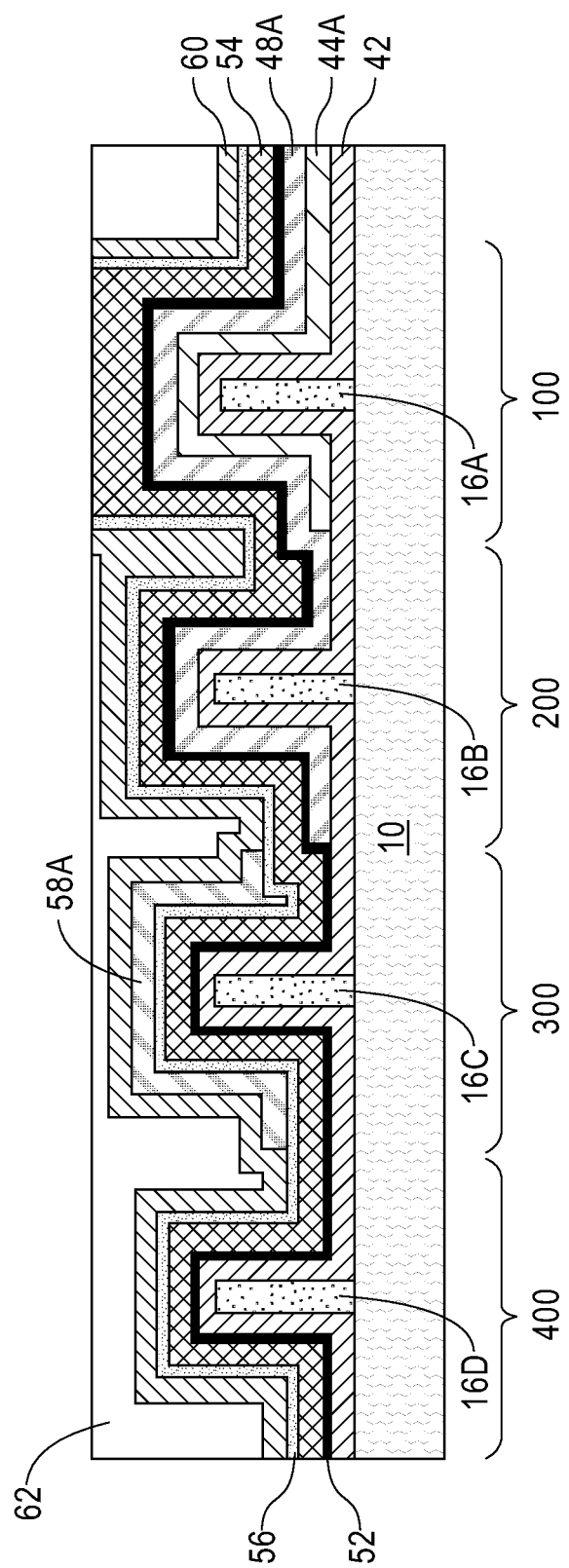
FIG. 18 is a cross-sectional view of the exemplary semiconductor structure of FIG. 17 after forming a first, a second, a third and a fourth gate stack portions in the gate cavity.

Referring to FIG. 18, portions of the gate electrode layer 62L, the adhesion layer 60L, if present, the metal cap layer portion 58, the etch stop layer 56L, if present, the n-type work function metal layer 54L, the barrier layer 52L, the p-type work function metal layer portion 48, the gate dielectric cap layer portion 44 and the gate dielectric layer 42L that are located above the topmost surface of the ILD layer 30 are removed by employing a planarization process, such as, for example, CMP. The remaining portion of the gate electrode layer 62L is herein referred to the gate electrode 62. The remaining portion of the adhesion layer 60L is herein referred to as the adhesion layer portion 60. The remaining portion of the metal cap layer portion 58 is herein referred to as the metal cap 58A. The remaining portion of the etch stop layer 56L is herein referred to as the etch stop layer portion 56. The remaining portion of the n-type work function metal layer 54L is herein referred to as the n-type work function metal 54. The remaining portion of the barrier layer 52L is herein referred to as the barrier layer portion 52. The remaining portion of the p-type work function metal layer portion 48 is herein referred to as the p-type work function metal 48A. The remaining portion of the gate dielectric cap layer portion 44 is herein referred to as the gate dielectric cap 44A. The remaining portion of the gate dielectric layer 42L is herein referred to as the gate dielectric 42.

A gate stack is thus formed in the gate cavity. The gate stack includes a first gate stack portion formed in a first portion of the gate cavity 32 located in the first device region 100, a second gate stack portion formed in a second portion of the gate cavity 32 located in the second device region 200, a third gate stack portion formed in a third portion of the gate cavity 32 located in the third device region 300, and a fourth gate stack portion formed in a fourth portion of the gate cavity 32 located in the fourth device region 400.

The first gate stack portion includes a first portion of the gate dielectric 42 located in the first device region 100, a gate dielectric cap 44A, a first portion of the first p-type work function metal 48A located in the in the first device region 100, a first portion of the barrier layer portion 52 located in the first device region 100, and a first portion of the n-type work function metal 54 located in the first device region 100. The first gate stack portion straddles over the channel portion of the first semiconductor fin 16A.

The second gate stack portion includes a second potion of the gate dielectric 42 located in the second device region 200, a second portion of the p-type work function metal 48A located in the second device region 200, a second portion of the barrier layer portion 52 located in the second device region 200, a second portion of the n-type work function metal 54 located in the second device region 200, a first portion of the optional etch stop layer portion 56 located in the second device region 200, a first portion of the optional adhesion layer portion 60 in the second device region 200, and a first portion of the gate electrode 62 located in the second device region 200. The second gate stack portion straddles over the channel portion of the second semiconductor fin 16B.

The third gate stack portion includes a third portion of the gate dielectric 42 located in the third device region 300, a third portion of the barrier layer portion 52 located in the third device region 300, a third portion of the n-type work function metal 54 located in the third device region 300, a second portion of the optional etch stop layer portion 56 located in the third device region 300, a metal cap 58A, a second portion of the optional adhesion layer portion 60 located in the third device region 300, and a second portion of the gate electrode 62 located in the third device region 300. The third gate stack portion straddles over the channel portion of the third semiconductor fin 16C.

The fourth gate stack portion includes a fourth portion of the gate dielectric 42 located in the fourth device region 400, a fourth portion of the barrier layer portion 52 located in the fourth device region 400, a fourth portion of the n-type work function metal 54 located in the fourth device region 400, a third portion of the optional etch stop layer portion 56 located in the fourth device region 400, a third portion of the optional adhesion layer portion 60 located in the fourth device region, and a third portion of the gate electrode 62 located in the fourth device region 400. The fourth gate stack portion straddles over the channel portion of the fourth semiconductor fin 16D.

In the present application, by manipulating composition of the metal layers in the different gate stack portions and the processing conditions in the formation of the metal layers, FinFETs with different threshold voltages are obtained. In the pFinFET region, the first pFinFET formed in the first device region 100 can have a threshold voltage lower than that of the second pFinFET formed in the second device region 200. The threshold voltage of the first pFinFET can be shifted by 50 mV to 150 mV with respect to that of the second pFinFET. In the nFinFET region, the first nFinFET formed in the third device region 300 can have a threshold voltage lower than that of the second nFinFET formed in the fourth device region 400. The threshold voltage of the first nFinFET can be shifted by 50 mV to 350 mV with respect to that of the second nFinFET. Moreover, because the patterning processes employed in the present application does not adversely impact the underlying the gate dielectric layer 42L and the interfacial layer, if present, FinFETs with improved reliability are obtained.

In one embodiment, one of the nFinFETs can be connected to either one of the first pFinFET and the second pFinFET to define a CMOS structure.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
   forming at least one first semiconductor fin located in a first device region of a substrate, at least one second semiconductor fin located in a second device region of the substrate, at least one third semiconductor fin located in a third device region of the substrate, and at least one fourth semiconductor fin located in a fourth device region of the substrate;
   forming a gate cavity exposing a channel portion of each of the at least one first semiconductor fin, the at least one second semiconductor fin, the at least one third semiconductor fin, and the at least one fourth semiconductor fin, wherein the gate cavity is laterally surrounded by an interlevel dielectric (ILD) layer;
   forming a gate dielectric layer on sidewalls and bottom surfaces of the gate cavity and a topmost surface of the ILD layer;
   forming a gate dielectric cap layer over the gate dielectric layer;
   removing a portion of the gate dielectric cap layer from the second, the third and the fourth device regions;
   forming a p-type work function metal layer over a portion of the gate dielectric layer exposed in the second, the third and the fourth device regions and a remaining portion of the gate dielectric cap layer located in the first device region;
   removing a portion of the p-type work function metal layer from the third and fourth device regions;
   forming a barrier layer over a portion of the gate dielectric layer exposed in the third and the fourth device regions and a remaining portion of the p-type work function metal layer located in the first and second device regions;
   forming an n-type work function metal layer over the barrier layer, wherein the n-type work function metal layer completely fills a first portion of the gate cavity located in the first device region;
   forming a metal cap layer over the n-type work function metal layer;
   removing a portion of the metal cap layer from the first, the second and the fourth device regions; and
   forming a gate electrode layer over portions of the n-type work function metal layer exposed in the first, the second and the fourth device regions and a remaining portion of the metal cap layer located in the third device region, wherein the gate electrode layer completely fills a remaining portion of the gate cavity.

2. The method of claim 1, further comprising annealing the gate dielectric cap layer prior to the patterning the gate dielectric cap layer.

3. The method of claim 2, wherein the annealing the gate dielectric cap layer comprises:
   forming a sacrificial cap layer on the gate dielectric cap layer;
   annealing the gate dielectric cap layer at an elevated temperature; and
   removing the sacrificial cap layer.

4. The method of claim 3, wherein the sacrificial cap layer comprises amorphous silicon or polysilicon.

5. The method of claim 3, further comprising forming a sacrificial hardmask layer on the annealed gate dielectric cap layer.

6. The method of claim 5, further comprising forming an etch stop layer on the n-type work function metal layer prior to the forming the metal cap layer.

7. The method of claim 6, further comprising forming an adhesion layer over the portions of the n-type work function metal layer exposed in the first, the second and the fourth device regions and the remaining portion of the metal cap layer located in the third device region prior to the forming the gate electrode layer.

8. The method of claim 1, further comprising removing portions of the gate electrode layer, the remaining portion of the metal cap layer, the n-type work function metal layer, the barrier layer, the remaining portion of the p-type work function metal layer, the remaining portion of the gate dielectric cap layer and the gate dielectric layer that are located above the topmost surface of the ILD layer.

9. The method of claim 1, wherein the forming the gate cavity comprises:
   forming a sacrificial gate stack over the channel portion of the at least one first semiconductor fin, the at least one second semiconductor fin, the at least one third semiconductor fin, and the at least one fourth semiconductor fin;
   forming a gate spacer on each sidewall of the sacrificial gate stack;
   forming the ILD layer laterally surrounding the gate spacer; and
   removing the sacrificial gate stack.

10. The method of claim 1, wherein the forming the at least one first semiconductor fin, the at least one second semiconductor fin, the at least one third semiconductor fin, and the at least one fourth semiconductor fin comprises:
    providing a bulk semiconductor substrate; and
    patterning an upper portion of the bulk semiconductor substrate.

11. The method of claim 1, wherein the forming the at least one first semiconductor fin, the at least one second semiconductor fin, the at least one third semiconductor fin, and the at least one fourth semiconductor fin comprises:
    providing a semiconductor-on-insulator substrate comprising a top semiconductor layer; and
    patterning the top semiconductor layer of the semiconductor-on-insulator substrate.

12. The method of claim 2, wherein the annealing is carried out in an ambient atmosphere containing nitrogen at a temperature from 600° C. to 1100° C.

13. The method of claim 1, wherein the forming the p-type workfunction metal layer comprises a conformal deposition process.

14. The method of claim 1, wherein the p-type workfunction metal layer comprises TiN.

15. The method of claim 1, wherein the forming the p-type workfunction metal layer comprises depositing a p-type workfunction metal at a temperature from 420° C. to 500° C.

16. The method of claim 1, wherein the n-type work function metal layer is selected from the group consisting of TiAlC, TaAlC, TiAl, Ti, and Al.

17. The method of claim 1, wherein the substrate is an insulator layer or a semiconductor material.

18. The method of claim 1, further comprising forming, prior to forming the gate cavity, first source/drain regions in each of the first and second device regions, and second source/drain regions in each of the third and fourth device regions.

19. The method of claim 18, wherein each of the first source/drain regions and each of the second source/drain regions are raised source/drain regions.

20. The method of claim 18, wherein the first source/drain regions in the first device region are formed into a portion of the at least one first semiconductor fin, the first source/drain regions in the second device region are formed into a portion of the at least one second semiconductor fin, the second source/drain regions in the third device region are formed into a portion of the at least one third semiconductor fin, and the second source/drain regions in the second device region are formed into a portion of the at least one fourth semiconductor fin.

* * * * *